United States Patent
Lee et al.

[11] Patent Number: 5,887,605
[45] Date of Patent: Mar. 30, 1999

[54] APPARATUS FOR CLEANING SEMICONDUCTOR WAFERS

[75] Inventors: Je-cheol Lee; Byung-jin Kim, both of Suwon, Rep. of Korea

[73] Assignee: Samsung Electronics Co., Ltd., Suwon, Rep. of Korea

[21] Appl. No.: 842,274

[22] Filed: Apr. 24, 1997

[30] Foreign Application Priority Data

Jun. 5, 1996 [KR] Rep. of Korea ............... 1996-20096

[51] Int. Cl.⁶ ......................................................... B08B 3/02
[52] U.S. Cl. ........................ 134/102.2; 134/153; 134/902
[58] Field of Search ................. 134/902, 102.1, 134/102.2, 102.3, 153; 156/345 LS, 345 L; 239/414

[56] References Cited

U.S. PATENT DOCUMENTS

| | | | |
|---|---|---|---|
| 2,960,710 | 11/1960 | McKeegan | 239/414 X |
| 3,012,921 | 12/1961 | Vaughan | 134/102.1 X |
| 3,188,238 | 6/1965 | Lyon | 134/102.2 X |
| 3,297,257 | 1/1967 | Roser | 134/102.2 X |
| 4,941,490 | 7/1990 | Gross | 134/102.3 X |
| 4,976,810 | 12/1990 | Masuda et al. | 156/345 LS X |
| 5,351,360 | 10/1994 | Suzuki et al. | 134/902 X |

*Primary Examiner*—Philip R. Coe
*Attorney, Agent, or Firm*—Jones, Volentine, Steinberg & Whitt, L.L.P.

[57] ABSTRACT

A semiconductor wafer cleaning apparatus is disclosed including a cleaning solution supply line for supplying a cleaning solution to a surface of a wafer, one end of which is connected to a cleaning solution supply source. A gas supply line is connected to a gas supply source to supply a gas to the surface of the wafer. A nozzle assembly is connected to respective second ends of the cleaning solution supply line and the gas supply line, the nozzle assembly having a spray nozzle facing the surface of the wafer, wherein the cleaning solution and gas supplied are mixed in the nozzle assembly.

9 Claims, 1 Drawing Sheet

APPARATUS FOR CLEANING SEMICONDUCTOR WAFERS

BACKGROUND OF THE INVENTION

1. Field of the Invention

The present invention relates to an apparatus and method of cleaning a semiconductor wafer and, more particularly, to an apparatus and method of cleaning a semiconductor wafer that is effectively removes a developer containing a photoresist from the wafer after an exposed photoresist is developed during photolithography in semiconductor device fabrication processes.

2. Discussion of the Related Art

Photolithography is used to form the pattern of a semiconductor device. Specifically, a photoresist is coated on a wafer, and a photomask is aligned above the wafer. The photoresist is then exposed through the photomask and developed using a developer, followed by removal of the developer containing the photoresist. What remains is the pattern of a semiconductor device.

A cleaning solution is used to remove the developer after the development of the photoresist. This cleaning process is carried out in such a manner that the cleaning solution is supplied to the surface of the wafer containing the developer while the wafer is rotated at a high speed, to thereby clean the developer containing the photoresist residue.

Referring to FIG. 1, a conventional wafer cleaning apparatus is constructed in such a manner that, when an air valve 14 is opened by the operation of a switching solenoid 10, deionized water (D.I. water) used as a cleaning solution flows through a D.I. water supply line 16 from a D.I. water supply source 12, and is supplied through a D.I. water outlet 18 to the surface of the wafer 20 by free fall, while the wafer rotates at a high speed.

In the aforementioned conventional wafer cleaning apparatus, D.I. water which falls on the wafer removes the developer as the D.I. water moves along the surface of the wafer toward the wafer edge due to the centrifugal force generated by the high-speed rotation of the wafer.

In this cleaning method, however, the vertical force resulting from the free fall of the D.I. water works on only that region of the wafer where the D.I. water falls directly. As a result, additional time and larger quantities of D.I. water are required in order to clean the developer left in a groove of a pattern located at a region other than the region on which the D.I. water falls.

SUMMARY OF THE INVENTION

Accordingly, the present invention is directed to an apparatus and method of cleaning a semiconductor wafer that substantially overcomes one or more of the problems due to limitations and disadvantages of the related art.

An object of the present invention is to provide an apparatus and method of cleaning a semiconductor wafer in which a cleaning solution is pressurized and sprayed on the overall surface of a wafer, which rotates at a high speed, so as to increase the cleaning force of a developer, to thereby reduce wafer cleaning time and cleaning solution consumption.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a semiconductor wafer cleaning apparatus comprising: a cleaning solution supply line connected at one end to a cleaning solution supply source for supplying a cleaning solution to a surface of a wafer; a gas supply line connected at one end to a gas supply source for supplying a gas to the surface of the wafer; and a nozzle assembly connected to respective second ends of the cleaning solution supply line and the gas supply line, the nozzle assembly having a spray nozzle facing the surface of the wafer, wherein the cleaning solution and gas supplied are mixed in the nozzle assembly.

The semiconductor wafer cleaning apparatus further includes air valves respectively set at approximately central linear locations of the cleaning solution supply line and gas supply line, and a switching solenoid for opening or closing the air valves simultaneously.

In addition, the spray nozzle has a plurality of openings in order to spray the cleaning solution supplied thereto. The openings may be arranged in a variety of configurations, including a fan shape. The gas may be, for example, nitrogen, and the cleaning solution may be D.I. water.

In the present invention, the gas supplied from the gas supply source and cleaning solution supplied from the cleaning solution supply source are mixed in the nozzle assembly so that the pressure of the gas is imparted to the cleaning solution. Accordingly, the cleaning solution is pressurized and sprayed together with the gas, through the spray nozzle attached to the end of the nozzle assembly and onto the surface of the wafer which rotates at a high speed, so as to apply a high pressure force to the developer left on the wafer surface. By doing so, the developer can be rapidly removed.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention, where:

FIG. 1 shows the configuration of a conventional wafer cleaning apparatus in a free fall mode; and FIG. 2 shows the configuration of a semiconductor wafer cleaning apparatus which pressurizes and sprays a cleaning solution together with a gas according to an embodiment of the present invention.

DETAILED DESCRIPTION OF PREFERRED EMBODIMENT

Reference will now be made in detail to the preferred embodiments of the present invention, examples of which are illustrated in the accompanying drawings.

Figure 1:
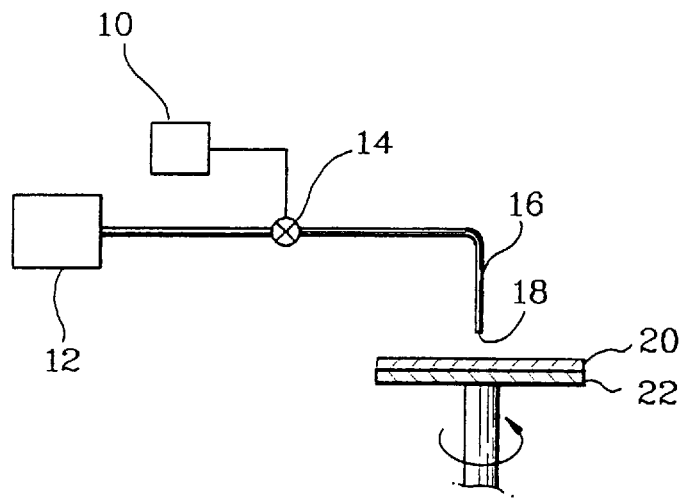
Figure 2:
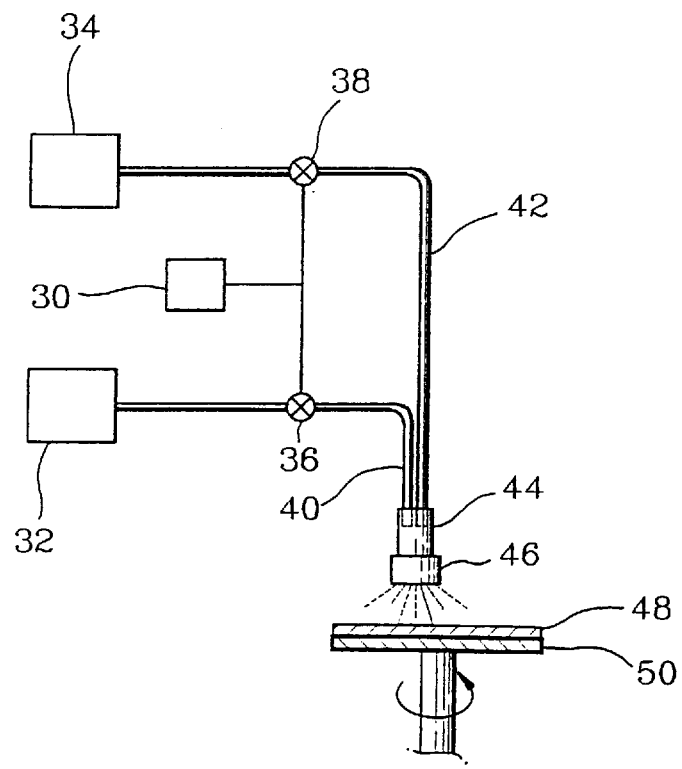

FIG. 2 illustrates a configuration of a semiconductor wafer cleaning apparatus in which D.I. water and nitrogen gas are simultaneously sprayed on the surface of a wafer. The apparatus of the present invention would comprise one module of a complete semiconductor development apparatus.

Referring to FIG. 2, a first air valve 36 is disposed in a D.I. water supply line 40. As shown in FIG. 2, the air valve 36 is set at approximately a central linear location in the water supply line 40, although it need not be. The air valve 36 opens or closes the flow of D.I. water from a D.I. water supply source 32 to supply D.I. water as a cleaning solution to the surface of a wafer.

A second air valve 38 is disposed in a gas supply line 42. As shown in FIG. 2, the air valve 38 is set at approximately a central linear location in the gas supply line 42, although it need not be. The air valve 38 opens or closes the flow of gas from a gas supply source 34. The gas may be, for example, nitrogen. The first and second air valves 36 and 38 are connected to a switching solenoid 30.

If a voltage is applied to the switching solenoid 30, air is simultaneously supplied to the air valves 36 and 38 from an air supply source (not shown) so as to open the air valves.

The D.I. water supply line 40 and nitrogen gas supply line 42 are connected to a nozzle assembly 44. The nozzle assembly 44 is located above wafer 48, which is placed on a wafer stage 50 that rotates at a high speed. The D.I. water and nitrogen gas are mixed in the nozzle assembly 44. A spray nozzle 46 is attached to the end of the nozzle assembly 44, with the spray nozzle 46 facing the surface of the wafer 48. The spray nozzle 46 includes a plurality of openings in the form of a fan. It is understood, however, that the plurality of openings made be arranged in other configurations as well in order to achieve the desired spraying area. The cleaning solution and gas are then sprayed through the openings onto the surface of the wafer.

In the aforementioned embodiment of the present invention, when a voltage is applied to the switching solenoid 30 in order to commence the process of removing the developer left on the surface of the wafer, air is supplied to the first and second air valves 36 and 38 from the air supply source (not shown) so as to open the valves 36 and 38 simultaneously. D.I. water and nitrogen gas pass through the valves 36 and 38 respectively located in the D.I. water supply line 40 and nitrogen gas supply line 42, and are mixed and pressurized in the nozzle assembly 44 connected to the ends of the lines 40 and 42. Then, the mixed as pressurized D.I. water and nitrogen gas are sprayed through the spray nozzle 46 onto the overall surface of the wafer 48 while the wafer rotates at a high speed.

In this embodiment, the vertical force of the pressurized D.I. water and nitrogen gas is applied to the outer regions of the wafer surface as well, such that any developer left in a groove of a pattern formed on the wafer is lifted upward by the vertical force. As a result, the developer is easily removed by the centrifugal force generated by high-speed rotation of the wafer. According to the present invention, the developer is rapidly removed after the development of the photoresist. This reduces the wafer cleaning time and the consumption of cleaning solution.

It will be apparent to those skilled in the art that various modifications and variations can be made in the apparatus and method of cleaning a semiconductor wafer of the present invention without departing from the spirit or scope of the invention set forth in the appended claims and their equivalents.

What is claimed is:

1. A semiconductor wafer cleaning apparatus comprising:
    a cleaning solution supply line connected at one end to a cleaning solution supply source for supplying a cleaning solution to a surface of a wafer;
    a gas supply line connected at one end to a gas supply source for supplying a gas to the surface of the wafer; and
    a nozzle assembly connected to respective second ends of said cleaning solution supply line and said gas supply line, the nozzle assembly having a spray nozzle facing the surface of the wafer, wherein the cleaning solution and gas supplied are mixed in the nozzle assembly.

2. The semiconductor wafer cleaning apparatus as claimed in claim 1, further comprising:
    air valves respectively set at approximately central linear locations of the cleaning solution supply line and gas supply line; and
    a switching solenoid for simultaneously opening or closing the air valves.

3. The semiconductor wafer cleaning apparatus as claimed in claim 1, wherein the nozzle assembly has a plurality of openings for spraying the cleaning solution supplied thereto.

4. The semiconductor wafer cleaning apparatus as claimed in claim 3, wherein the plurality of openings in the nozzle assembly are arranged in a fan shape.

5. The semiconductor wafer cleaning apparatus as claimed in claim 1, wherein the gas is nitrogen.

6. The semiconductor wafer cleaning apparatus as claimed in claim 1, wherein the cleaning solution is D.I. water.

7. The semiconductor wafer cleaning apparatus as claimed in claim 1, further comprising a control for supplying the cleaning solution and the gas to the nozzle while the wafer is rotating.

8. The semiconductor wafer cleaning apparatus as claimed in claim 7, wherein the nozzle supplies, with vertical force, the cleaning solution and the gas to an overall surface of the wafer upon complete rotation of the wafer.

9. The semiconductor wafer cleaning apparatus as claimed in claim 1, wherein the nozzle supplies, with vertical force, the cleaning solution and the gas to outer regions of the wafer.

* * * * *